United States Patent [19]
Saida et al.

[11] Patent Number: 6,146,938
[45] Date of Patent: Nov. 14, 2000

[54] METHOD OF FABRICATING SEMICONDUCTOR DEVICE

[75] Inventors: Shigehiko Saida; Yoshitaka Tsunashima; Tsutomu Sato, all of Yokohama, Japan

[73] Assignee: Kabushiki Kaisha Toshiba, Kawasaki, Japan

[21] Appl. No.: 09/340,143

[22] Filed: Jun. 28, 1999

[30] Foreign Application Priority Data

Jun. 29, 1998 [JP] Japan .................................. 10-182427

[51] Int. Cl.⁷ ................................................ H01L 21/8242
[52] U.S. Cl. .......................... 438/239; 438/381; 438/393; 438/394
[58] Field of Search .................... 438/239, 381, 438/393, 394

[56] References Cited

U.S. PATENT DOCUMENTS

| | | |
|---|---|---|
| 5,670,431 | 9/1997 | Huanga et al. . |
| 5,766,785 | 6/1998 | Yuuichi et al. . |
| 5,789,290 | 8/1998 | Sun . |
| 5,989,956 | 11/1999 | Huang . |

FOREIGN PATENT DOCUMENTS 6-37079   2/1994   Japan .

*Primary Examiner*—Trung Dang
*Attorney, Agent, or Firm*—Finnegan, Henderson, Farabow, Garrett & Dunner, L.L.P.

[57] ABSTRACT

A native film formed on the surface of a silicon substrate is removed. Arsenic is doped into the surface of the silicon substrate to form an n-type impurity diffusion layer as a lower capacitor electrode. A silicon nitride film as a capacitor insulating film is formed on the n-type impurity diffusion layer without growing any oxide film on the surface of the n-type impurity diffusion layer. An upper capacitor electrode is formed on the silicon nitride film.

12 Claims, 8 Drawing Sheets

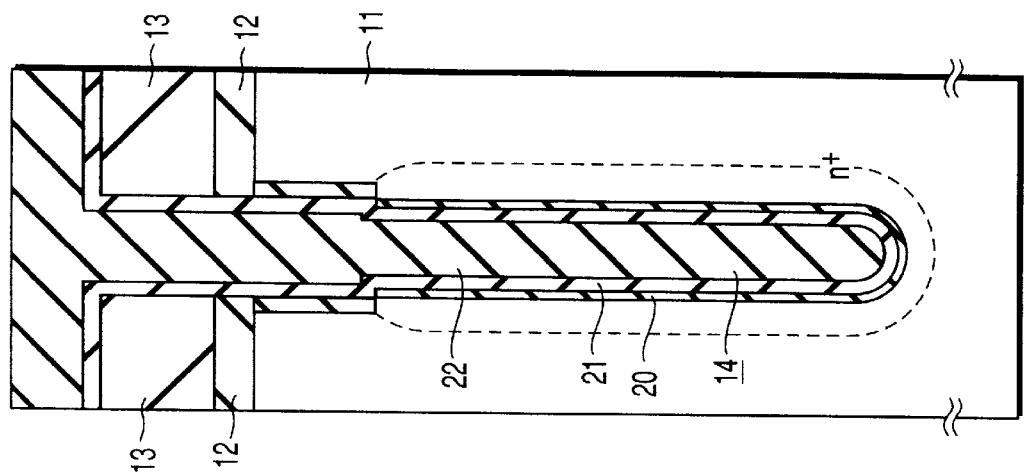
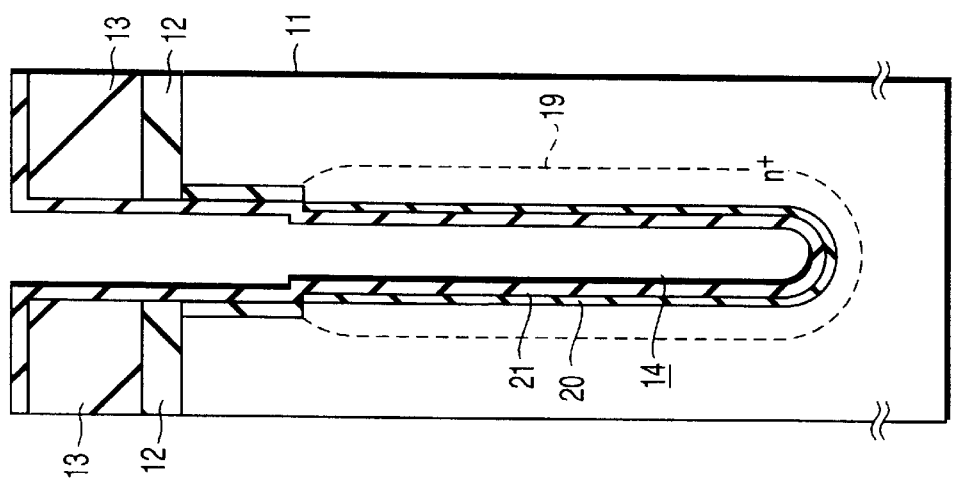
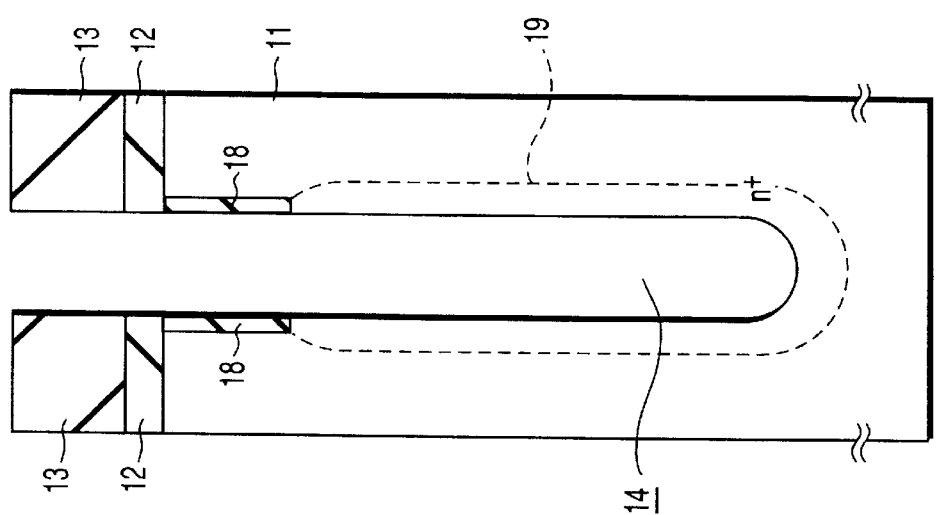

METHOD OF FABRICATING SEMICONDUCTOR DEVICE

BACKGROUND OF THE INVENTION

Conventionally, a magnetic disk unit has been widely used as a memory of an information processing apparatus. However, a magnetic disk unit is weak against shocks because a highly precise driving mechanism is contained. Also, since a recording medium is mechanically accessed, no high-speed access is possible.

Recently, therefore, the development of a semiconductor memory is being sought as a memory of an information processing apparatus. A semiconductor memory is strong against shocks because no driving mechanism is contained, and high-speed access is possible because data is electrically read out.

With the recent progress of semiconductor technologies, particularly the progress of micro-patterning technologies, micropatterning of memory cells, i.e., high integration of semiconductor memories has rapidly advanced. This poses a problem concerning the storage characteristics of a memory cell.

For example, in a DRAM in which a memory cell is constructed by connecting a MOS transistor and a capacitor in series, the capacitance tends to decrease with a reduction in the capacitor area caused by high integration. This results in a soft error, i.e., false memory contents are read out, or stored contents are destroyed by $\alpha$-rays.

To solve this problem, it is important not to reduce the capacitance although memory cell geometries shrink. To this end, it is essential to decrease the thickness of a capacitor insulating film as well as to increase the capacitor area. An example of a method of forming a thin insulating film is to form a silicon nitride film by deposited a silicon film using LPCVD method after thermally nitriding a native oxide film on the surface of a silicon substrate.

Unfortunately, a silicon nitride film formed by this method has a large leakage current and hence is unsuitable for a capacitor insulating film. From this viewpoint, it is presumably effective to form a capacitor insulating film devoid of a native film in order to further decrease the thickness of a capacitor insulating film.

One capacitor insulating film formation method taking account of this problem removes a native film by high-temperature annealing in an ambient containing hydrogen or silane and forms a silicon nitride film by thermal nitridation or chemical vapor deposition (CVD).

If a native film is removed by high-temperature annealing, however, an impurity in an impurity diffusion layer (one capacitor electrode) formed on the surface of a silicon substrate outdiffuses and lowers the impurity concentration in the impurity diffusion layer. This lowers the capacitance of a depletion layer formed in the silicon substrate. As a consequence, the electrical capacitance lowers, and the apparent leakage current increases.

Another native film removing method uses hydrofluoric acid vapor. This method has the advantage that a native film can be removed at a low temperature. However, hydrofluoric acid remains on a silicon substrate. Therefore, when a silicon nitride film is formed by CVD, the thickness of this silicon nitride film varies microscopically because of the low nucleus density along the surface of the sillicon substrate, and surface roughness increases. Consequently, a thin film portion is formed, and the leakage current increases in this portion.

BRIEF SUMMARY OF THE INVENTION

As described above, to further decrease the thickness of a capacitor insulating film, it is considered to be effective to remove a native film on the surface of an impurity diffusion layer by high-temperature heat treatment after the formation of the impurity diffusion layer and before the formation of the capacitor insulating film. However, a method of this type has the problem that an impurity in the impurity diffusion layer diffuses outward by the high-temperature heat treatment and increases the apparent leakage current.

The present invention has been made in consideration of the above situation, and has as its object to provide a semiconductor device fabrication method capable of suppressing any increase in leakage current which prevents micropatterning and having a capacitor formation step of forming an impurity diffusion layer as one capacitor electrode.

To achieve the above object, a method of fabricating a semiconductor device according to the present invention comprises the steps of removing an oxide film formed on a surface of a semiconductor substrate, doping an impurity into the surface of the semiconductor substrate to form an impurity diffusion layer as a first capacitor electrode, forming a capacitor insulating film on the impurity diffusion layer in a condition in which no oxide film grows, and forming a second capacitor electrode on the capacitor insulating film.

In this method, the step of forming the oxide film is performed by heat treatment at 800° C. or more in an ambient containing, e.g., hydrogen or silane. The oxide film is a native film or an oxide film (native film) which is formed when wafer is loaded into LPCVD reactor heat treatment is performed with no exposure to the atmosphere and has a thickness larger than that of a usual native film.

The step of doping the impurity is performed by heat treatment at 800° C. more in an ambient containing at least one of arsine and phosphine.

The step of forming the capacitor insulating film forms a silicon nitride film by, e.g., chemical vapor deposition.

The step of forming the capacitor insulating film includes the step of forming a first silicon nitride film by, e.g., thermal nitridation. A second silicon nitride film can also be formed on the first silicon nitride film by chemical vapor deposition.

The step of forming the capacitor insulating film preferably comprises the step of repeating a series of heat treatment steps a plurality of times. The series of heat treatment steps include a first heat treatment step performed in a first gas ambient containing silicon and not containing nitrogen and a second heat treatment step performed in a second gas ambient containing nitrogen and not containing silicon.

The first gas ambient contains a gas of at least one of silicon tetrachloride, silicon trichloride, and silicon dichloride.

The second gas ambient contains a gas of at least one of ammonia, ammonia trifluoride, hydrazine, dimethylhydrazine, and monomethylhydrazine.

The surface of the impurity diffusion layer is preferably nitrided before the first heat treatment step.

In the present invention, after an oxide film formed on the surface of silicon substrate is removed, an impurity is doped into the surface of a semi-conductor substrate to form an impurity diffusion layer. In principle, therefore, the impurity concentration in the impurity diffusion layer does not lower in the oxide film removal step.

Accordingly, the present invention can effectively suppress the lowering of the impurity concentration in the impurity diffusion layer, which causes a leakage current, compared to a method (conventional method) by which an oxide film is removed after an impurity diffusion layer is formed. That is, although the conventional method can reduce a leakage current, the present invention can further reduce the leakage current.

Additionally, in the present invention, after an oxide film on the surface of an impurity diffusion layer is removed, a capacitor insulating film is formed on the impurity diffusion layer in a state in which no oxide film grows. Accordingly, it is possible to prevent the formation of an oxide film, which causes a leakage current, on the surface of the impurity diffusion layer.

If an oxide film is formed and a nitride film is formed on this oxide film by CVD, the nitride film grows ununiformly, so the film thickness of this nitride film microscopically varies. Although no such film thickness nonuniformity is produced if the oxide film is thermally nitrided, the nitrided oxide film has a large leakage current, so the leakage current increases.

As described above, the present invention can effectively suppress the increase in leakage current which prevents further shrink in device geometries. This allows easy formation of a fine capacitor having an impurity diffusion layer as one capacitor electrode.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

FIGS. 8A to 8I are sectional views showing the steps of a method of forming a trench capacitor of a DRAM according to the second embodiment of the present invention.

DETAILED DESCRIPTION OF THE INVENTION

Embodiments of the present invention will be described in detail below with reference to the accompanying drawings.
First Embodiment FIGS. 1A to 1E are sectional views showing the steps of a method of forming a plane capacitor according to the first embodiment of the present invention.

Figure 1A:
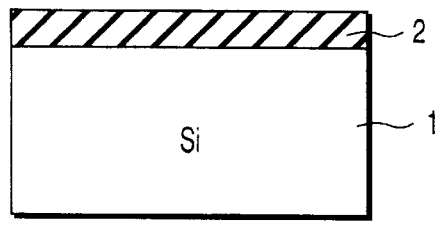
FIGS. 1A to 1E are sectional views showing the steps of a method of forming a capacitor according to the first embodiment of the present invention.

First, as shown in FIG. 1A, contaminants such as metals existing on a single-crystal silicon substrate 1 are cleaned in a $HCl-H_2O_2$ solution. Since this cleaning solution contains hydrogen peroxide water, a native layer 2 forms on the surface of the silicon substrate 1 upon cleaning. The film thickness of this native layer 2 is, e.g., about 1.0 nm.

Figure 1B:
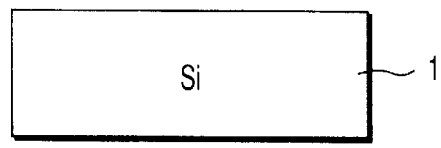

As shown in FIG. 1B, the silicon substrate 1 is heated in a hydrogen ambient at 900° C. and 3 Torr for 1 hr to remove the native layer 2.

Figure 1C:
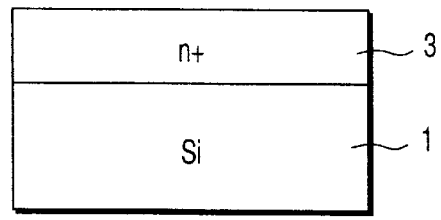

As shown in FIG. 1C, the silicon substrate 1 is annealed in a 1 at. % $AsH_3$ diluted with $H_2$ ambient at 900° C. and 100 Torr for 1 hr to form a heavily doped n-type impurity diffusion layer 3 as a lower capacitor electrode on the surface of the silicon substrate 1. Note that the native layer 2 functions as a passivation film for protecting the surface of the silicon substrate 1 from contamination and damages before the n-type impurity diffusion layer 3 is formed.

Figure 1D:
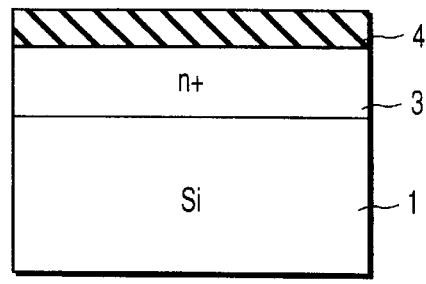

As shown in FIG. 1D, a 6.0-nm thick silicon nitride film 4 as a capacitor insulating film is successively formed on the n-type impurity diffusion layer 3 in the same processing vessel as used to form the n-type impurity diffusion layer 3 without breaking vacuum (without being exposed to the atmosphere). This silicon nitride film 4 is formed by CVD at a pressure of 0.5 Torr and a film formation temperature of 700° C. by using a gas mixture of dichlorosilane and ammonia as a source gas.

Since the silicon nitride film 4 is thus successively formed in vacuum, it is possible to prevent the reoxidation of the n-type impurity diffusion layer 3 and thereby prevent the formation of a native film on the surface of the n-type impurity diffusion layer 3.

That is, the silicon nitride film 4 can be formed on the surface of the n-type impurity diffusion layer 3 with no native film which increases the leakage current existing on the surface of the n-type impurity diffusion layer 3. A native film increases the leakage current because the silicon nitride film 4 grows ununiformly due to the formation of a native film and the film thickness of the silicon nitride film 4 microscopically varies.

Figure 1E:
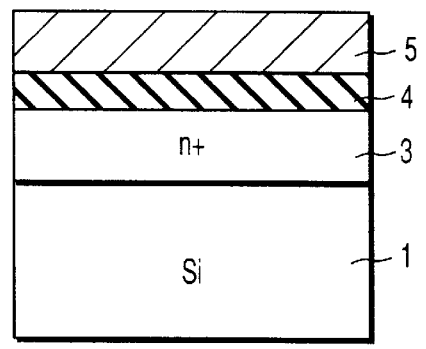

Finally, as shown in FIG. 1E, an upper capacitor electrode 5 is formed on the silicon nitride film 4 to complete the capacitor.

Figure 2:
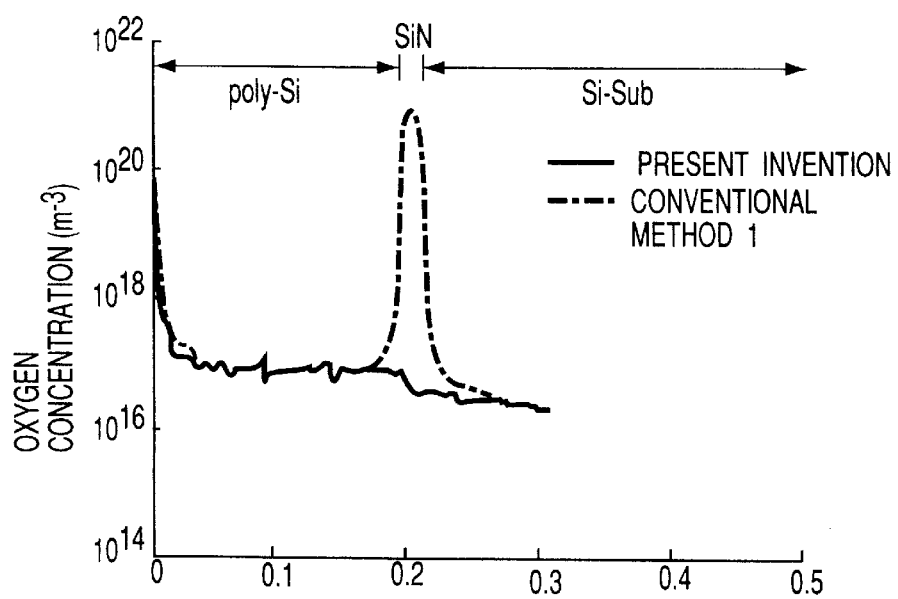
FIG. 2 is a graph showing the oxygen concentration distribution in an n-type impurity diffusion layer of the capacitor of the first embodiment and that of a capacitor formed by a first conventional method.

FIG. 2 shows the oxygen concentration distribution in the n-type impurity diffusion layer 3 of the capacitor formed by the method of this embodiment (PRESENT INVENTION) and that of a capacitor formed by a first conventional method (CONVENTIONAL METHOD 1).

In this first conventional method, the silicon substrate 1 is exposed to the atmosphere after the formation of the n-type impurity diffusion layer 3. When the silicon substrate 1 is loaded into a furnace, the surface of the silicon substrate 1 thermally oxidizes in the presence of oxygen loaded into the furnace. After that, the silicon nitride film 4 is formed on the oxidized surface. This is the difference from this embodiment.

FIG. 2 shows that this embodiment can sufficiently lower the oxygen concentration in the interface between the n-type impurity diffusion layer 3 and the silicon nitride film 4 compared to the first conventional method. This indicates that this embodiment can effectively prevent the formation of a native film on the surface of the silicon substrate 1 after the removal of the native layer 2.

This is so presumably because the native layer 2 formed on the surface of the silicon substrate 1 is well removed by the heat treatment in the hydrogen ambient and the reformation of an oxide film (layer) such as a native film can be effectively prevented by successively forming the silicon nitride film 4 in vacuum.

Figure 3:
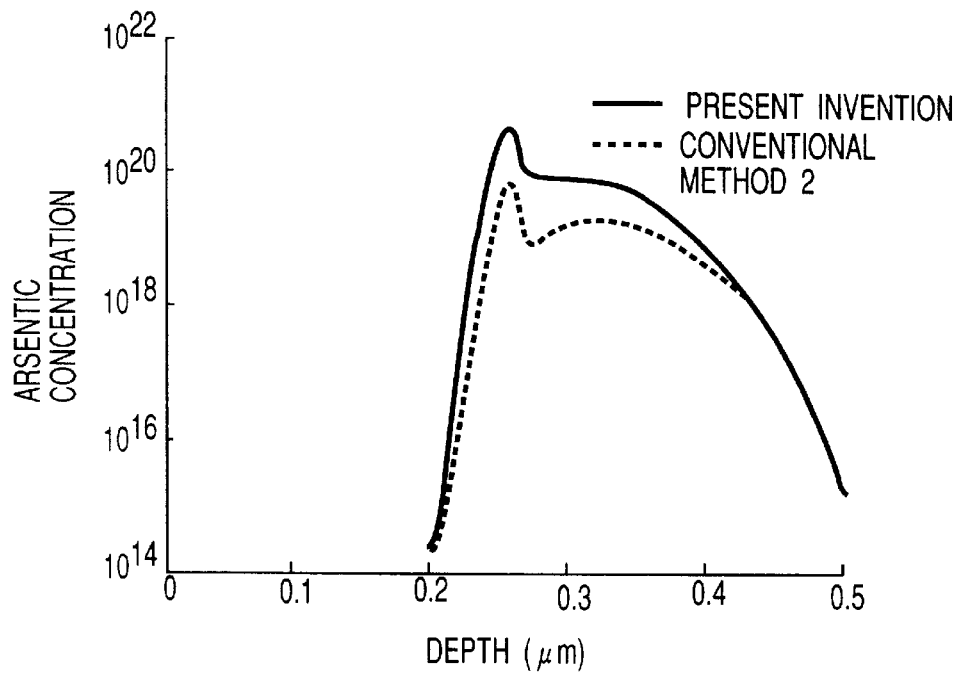
FIG. 3 is a graph showing the arsenic concentration distribution in the n-type impurity diffusion layer of the capacitor of the first embodiment and that of a capacitor formed by a second conventional method.

FIG. 3 shows the arsenic concentration distribution in the n-type impurity diffusion layer 3 of the capacitor formed by the formation method of this embodiment (PRESENT INVENTION) and that of a capacitor formed by a second conventional method (CONVENTIONAL METHOD 2).

In this second conventional method, the silicon substrate 1 is exposed to the atmosphere after the formation of the n-type impurity diffusion layer 3. A native film formed on the surface of the silicon substrate 1 is removed, and then the silicon nitride film 4 is formed by CVD. This is the difference from this embodiment.

FIG. 3 shows that the arsenic concentration in the n-type impurity diffusion layer 3 in this embodiment is higher than that in the second conventional method. Also, the arsenic concentration distribution immediately after the formation of the n-type impurity diffusion layer 3 reveals that the arsenic concentration in the n-type impurity diffusion layer 3 does not lower even after the formation of the silicon nitride layer 4 in this embodiment.

When the step of forming an n-type impurity layer and the step of forming a silicon nitride film are performed in the same batch type CVD furnace, gases such as AsH3 and PH3 diffused and consumed in silica parts such as the furnace tube constituting the CVD furnace and the boat for supporting a wafer are reduced because the silica parts are covered with the nitride film. This can increase the concentration of the impurity layer formed on the wafer. The same effect can be obtained even if the silica parts such as the furnace tube and boat constituting the CVD furnace are made of material (for example SiC) in which As and P can hardly be diffused.

Figure 4:
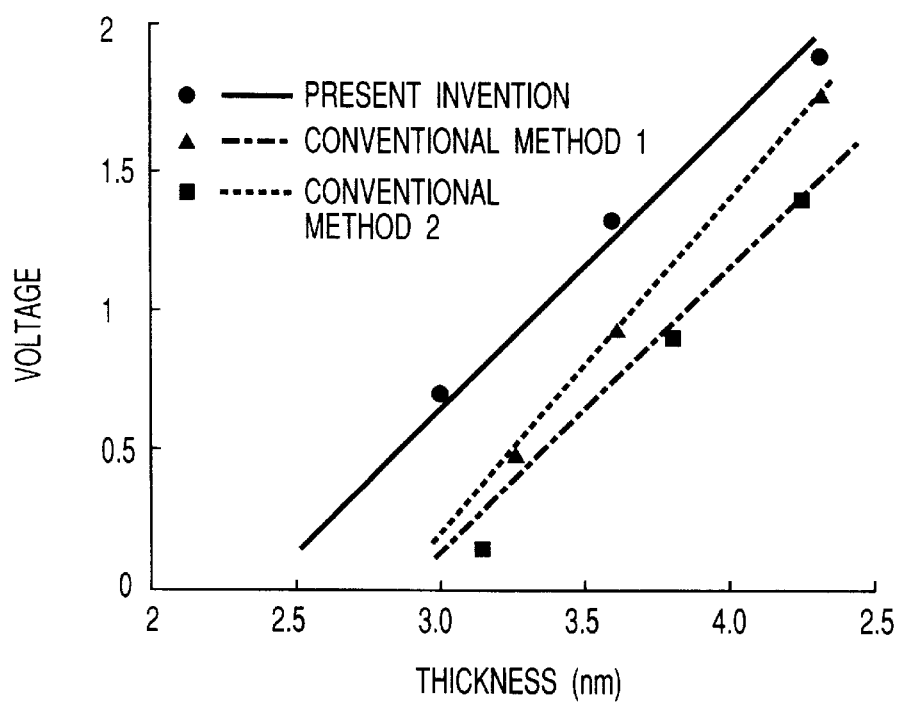
FIG. 4 is a graph showing the Leakage current characteristics of the capacitors formed by the method of the first embodiment and the first and second conventional methods.

FIG. 4 shows the Leakage current characteristics of the capacitors formed by the method of this embodiment and the first and second conventional methods.

FIG. 4 indicates that the method of this embodiment can form a capacitor having a lower leakage current than those in the first and second conventional methods. The reason for this is probably as follows. That is, in the first conventional method, the removal of the native film is unsatisfactory, and the residual native film increases the leakage current. In the second conventional method, the arsenic concentration in the n-type impurity diffusion layer lowers, the electrical capacitance lowers accordingly, and this increases the apparent leakage current.

In this embodiment as described above, after the native layer 2 formed on the surface of the silicon substrate 1 is removed, the n-type impurity diffusion layer 3 is formed on the surface of the silicon substrate 1. Therefore, it is possible to effectively suppress a reduction of the impurity concentration in the n-type impurity diffusion layer, which causes a leakage current. Also, in this embodiment the silicon nitride film is successively formed in vacuum so that no native film which causes a leakage current grows on the surface of the n-type impurity diffusion layer 3. In this manner, the lowering of an impurity concentration and the formation of a native film which cause a leakage current can be prevented. This allows easy formation of a fine capacitor.

A more preferred method of forming the silicon nitride film 4 will be described below. This formation method can effectively reduce hydrogen and chlorine (e.g., N—H bond and Si—Cl bond) which remain in the silicon nitride film 4 and form a leakage current path.

Figure 5A:
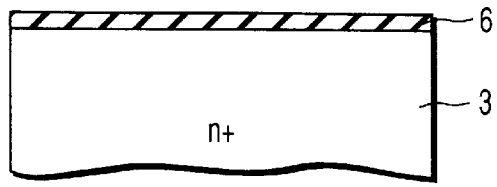
FIGS. 5A to 5D are sectional views showing the steps of a more preferred method of forming a silicon nitride film of the first embodiment.

First, as shown in FIG. 5A, the surface of the n-type impurity diffusion layer 3 is successively thermally nitrided in the same processing vessel as used to form the n-type impurity diffusion layer 3 without breaking vacuum (without being exposed to the atmosphere), thereby forming a thin nitride layer 6 on the surface of the n-type impurity diffusion layer 3.

Figure 5B:
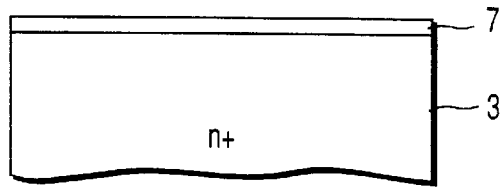

As shown in FIG. 5B, a silicon layer 7 having a thickness of a monoatomic layer is formed on the surface of the n-type impurity diffusion layer 3 by first annealing (first heat treatment) using silicon tetrachloride.

As will be described later, this silicon layer 7 is formed because N in the nitride layer 6 is substituted by $SiCl_3$. The annealing conditions are 800° C., 1 min, and 0.5 Torr.

Figure 5C:
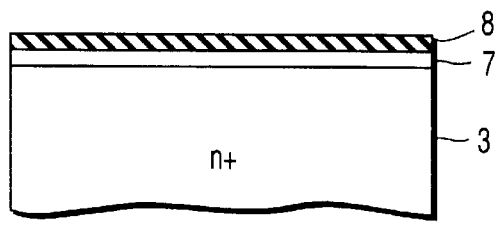

After the silicon tetrachloride in the processing vessel is replaced with nitrogen, as shown in FIG. 5C, a nitrogen layer 8 (having N—H) whose thickness is a monoatomic layer is formed on the silicon layer 7 by second annealing (second heat treatment) using ammonia.

As will be described later, this nitrogen layer 8 is formed because three Cl atoms bonded to the surface of the silicon layer 7 are substituted by $NH_2$. The annealing conditions are the same as the aforementioned annealing conditions using silicon tetrachloride, i.e., 800° C., 1 min, and 0.5 Torr.

A series of annealing steps including the first annealing and the second annealing form a siliconn nitride film (silicon layer 7 as a monoatomic layer+ nitrogen layer 8 as a monoatomic layer) having a thickness of a monoatomic layer.

Figure 5D:
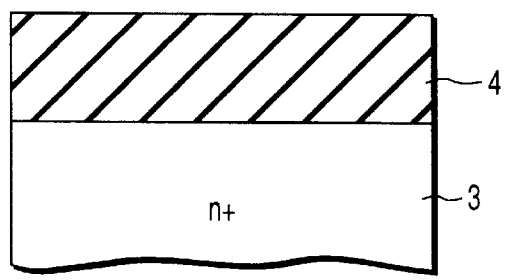

After that, the series of annealing steps described above, i.e., the series of formation steps including the step of forming the silicon layer 7 as a monoatomic layer shown in FIG. 5B and the step of forming the nitrogen layer 8 as a monoatomic layer shown in FIG. 5C are repeated 40 times to form a 4.0-nm thick silicon nitride film 4 as shown in FIG. 5D.

Figure 6:
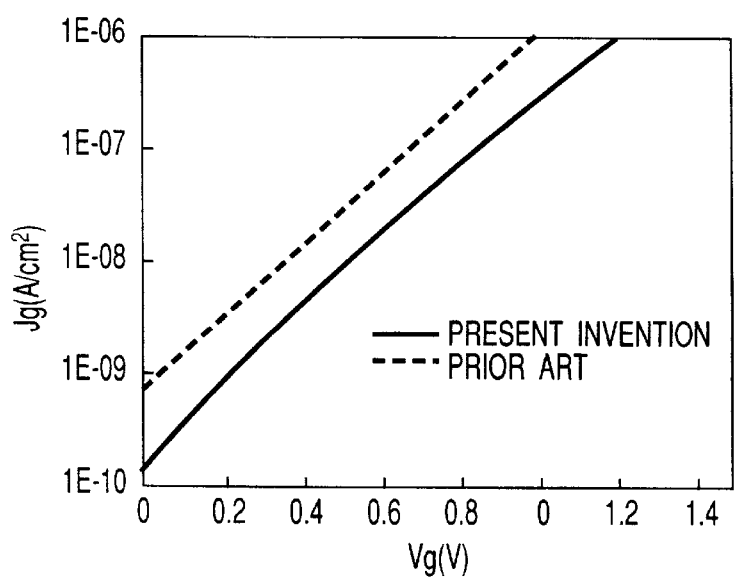
FIG. 6 is a graph showing the gate voltage dependence of the leakage current of a MIS capacitor in which a silicon nitride film is formed in accordance with the method shown in FIGS. 5A to 5D and the gate voltage dependence of the leakage current of a MIS capacitor in which a silicon nitride film is formed by a conventional method.

FIG. 6 shows the result (the dependence of a current density Jg on a gate voltage Vg) of comparison of leakage currents in a MIS capacitor (PRESENT INVENTION) in which the silicon nitride film 4 (capacitor insulating film) is formed in accordance with the method shown in FIGS. 5A to 5D and a MIS capacitor (PRIOR ART) in which a silicon nitride film (capacitor insulating film) is formed by CVD using a gas mixture of silicon tetrachloride gas and ammonia gas as a source gas.

FIG. 6 shows that the leakage current is lower in this embodiment. The reason for this is presumably that the silicon nitride film 4 is formed by alternately supplying silicon tetrachloride and ammonia in this embodiment, so impurities such as hydrogen and chlorine (N—H bond and Si—Cl bond) in the silicon nitride film 4 can be effectively reduced.

The reason why the impurities such as hydrogen and chlorine (N—H bond and Si—Cl bond) in the silicon nitride film 4 can be effectively reduced is probably as follows.

Figure 7A:
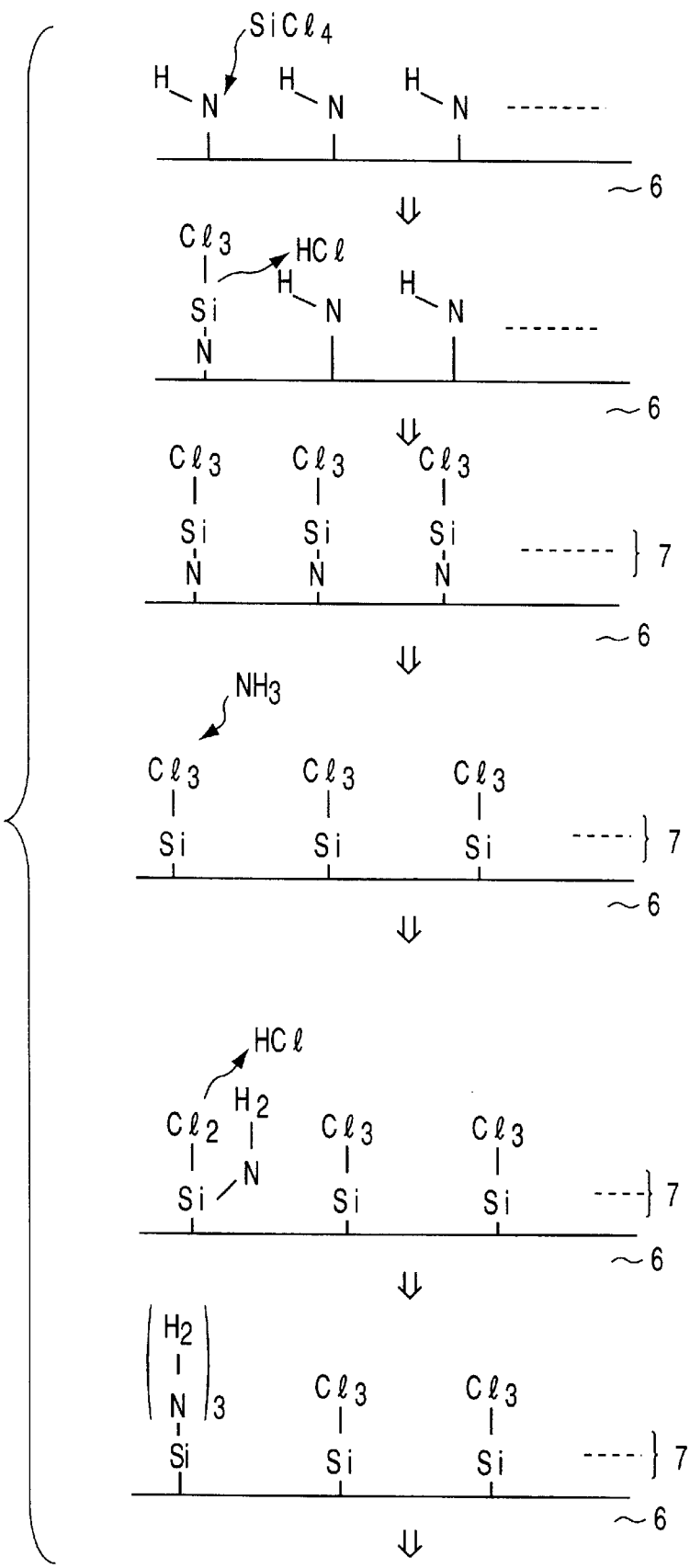
FIGS. 7A and 7B are schematic views showing the process of forming a silicon layer as a monoatomic layer constructing the silicon nitride film shown in FIGS. 5A to 5D.

First, as shown in FIG. 7A, when annealing using silicon tetrachloride ($SiCl_4$) is performed, the nitride layer 6 reacts with $SiCl_4$, and hydrogen of N—H bond in the nitride layer 6 is substituted by $SiCl_3$. When other decomposition reaction proceeds to substitute all N atoms in the nitride layer 6 with SiCl$_3$, a silicon layer 7 as a monoatomic layer having a surface to which Cl$_3$ bonds is formed.

Even when silicon tetrachloride is kept supplied, i.e., the annealing is continued after that, this silicon layer 7 does not become thicker than a monoatomic layer. That is, the silicon layer 7 can be self-limitedly formed. Although the silicon layer 7 may become thicker than a monoatomic layer if some other reaction occurs, this possibility is low when a silicon source such as silicon tetrachloride is used.

Figure 7B:
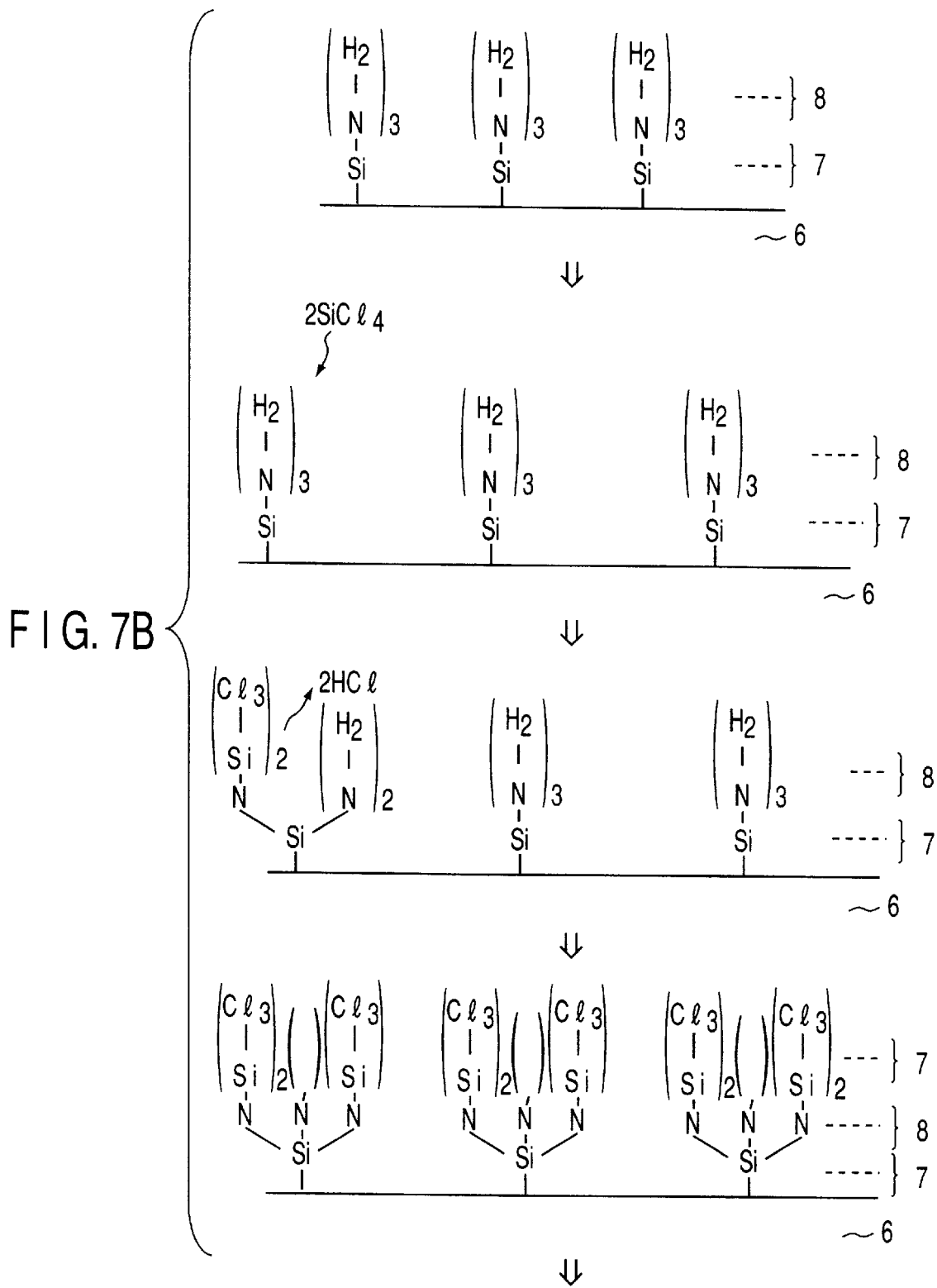

When annealing using ammonia (NH$_3$) is performed, as shown in FIG. 7B, SiCl$_3$ reacts with NH$_3$, and Cl in SiCl$_3$ is substituted by NH$_2$. When this reaction proceeds to substitute all Cl atoms in SiCl$_3$ with NH$_2$, a nitrogen layer 8 having a surface to which H$_2$ bonds is formed. As a consequence, Si—Cl bonds disappear.

Even when ammonia is kept supplied, i.e., the annealing is continued after that, the nitrogen layer 8 does not become thicker than a monoatomic layer unless another reaction takes place. That is, the nitrogen layer 8 can be self-limitedly formed. Although the nitrogen layer 8 may become thicker than a monoatomic layer if some other reaction occurs, this possibility is low when a nitrogen source such as ammonia is used.

When annealing using silicon tetrachloride is performed as shown in FIG. 7B, NH$_2$ reacts with SiCl$_4$ to substitute two hydrogen atoms in NH$_2$ with (SiCl$_3$)$_2$. When this reaction proceeds to replace hydrogen atoms in NH$_2$ with (SiCl$_3$)$_2$, a silicon layer 7 as a monoatomic layer is self-limitedly formed. As a consequence, N—H bonds disappear.

By alternately repeating the steps of forming a nitrogen layer 8 as a monoatomic layer and a silicon layer 7 as a monoatomic layer, a silicon nitride film 4 in which the contents of impurities such as hydrogen and chlorine (N—H bond and Si—Cl bond) are satisfactorily small is formed. That is, a silicon nitride film 4 in which impurities such as hydrogen and chlorine (N—H bond and Si—Cl bond) exist only on the surface is basically formed.

Also, a nitrogen layer 8 and a silicon layer 7 can be alternately formed in units of monoatomic layers as described above. Accordingly, a silicon nitride film 4 can be formed with good step coverage on a groove or projection having an aspect ratio.

The preferred formation method of the silicon nitride film 4 described above can be modified as follows.

For example, in this embodiment the annealing conditions using silicon tetrachloride are 800° C., 1 min, and 0.5 Torr. However, the annealing conditions are not limited to these conditions. The conditions need only be that no polycrystalline silicon forms when annealing using silicon tetrachloride is performed and silicon reacts with the under N—H group. Preferably, the temperature and pressure are set as high as possible within the above range to enhance the effect of removing hydrogen and chlorine.

If the annealing temperature is too high, polycrystalline silicon forms. Therefore, the annealing temperature must be equal to or lower than a temperature at which the silicon source decomposes. If the pressure is too high, polycrystalline silicon forms. If the pressure is too low, the surface reaction does not sufficiently proceed.

When these factors are taken into consideration, preferable annealing conditions when a silicon source such as silicon tetrachloride is used are generally 600° C. to 950° C. and 0.1 Torr to 10 Torr.

On the other hand, the temperature of annealing using ammonia is preferably as high as possible, e.g., 600° C. to 1,000° C. Note that this upper-limiting value of 1,000° C. is determined by the present technical level, so annealing at higher temperatures can be performed when the technologies advance in the future. The pressure is preferably 0.5 Torr to 100 Torr.

Although ammonia is used as a nitrogen source, this nitrogen source need not always be ammonia. For example, hydrazine or nitrogen trifluoride can be used instead of ammonia. Furthermore, at least two of ammonia, hydrazine, and nitrogen trifluoride can be simultaneously used.

Although silicon tetrachloride is used as a silicon source, this silicon source need not always be silicon tetrachloride. For example, silicon trichloride or silicon dichloride can be used instead of silicon tetrachloride. Furthermore, at least two of silicon tetrachloride, silicon trichloride, and silicon dichloride can be simultaneously used.

In the above embodiment, the silicon nitride film 4 is formed after the nitride layer 6 is formed by nitriding the surface of the n-type impurity diffusion layer 3. This is so because the nitridation can increase the adsorption points of silicon tetrachloride and thereby suppress island-like growth of the silicon nitride film 4.

Accordingly, other processing than nitridation can be performed as long as the processing can increase the adsorption points of silicon tetrachloride. For example, the surface natural nitride film can be removed.

In this embodiment, however, the n-type impurity diffusion layer 3 is successively formed in without breaking vacuum, so no native film originally exists on the surface of the n-type impurity diffusion layer 3. Therefore, annealing using silicon tetrachloride can be performed immediately after the formation of the n-type impurity diffusion layer 3. This embodiment is more preferable the conventional CVD method because the embodiment is insensitive to surface state and silicon nitride film is uniformly deposited in the case of incomplete of the native oxide removal.

If this is the case, the nitrogen layer 8 is formed on and below the silicon layer 7 at the same time when annealing using ammonia is performed in the next step. Consequently, it is possible to obtain substantially the same structure as when the nitride layer 6 is formed by nitriding the surface of the n-type impurity diffusion layer 3.

Also, nitrogen is used to substitute the source gas in the above embodiment, but nitrogen need not always be used. For example, an inert gas such as argon or helium, or hydrogen chloride or whydrazine can be used instead of nitrogen. These embodiment can be carried out by a batch type LPCVD or a single wafer multi-chamber type CVD.

Second Embodiment

FIGS. 8A to 8J are sectional views showing the steps of forming a trench capacitor of a DRAM cell according to the second embodiment of the present invention.

Figure 8C:
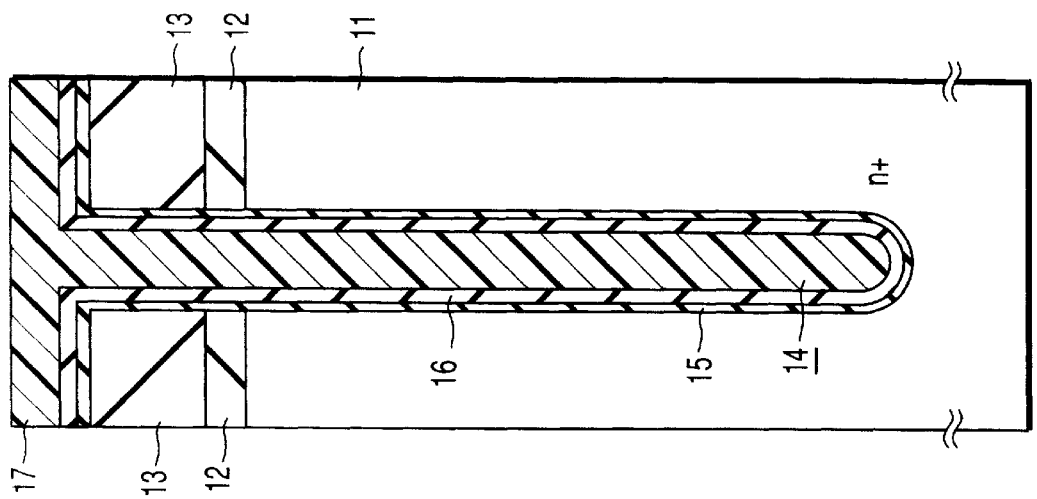
Figure 8B:
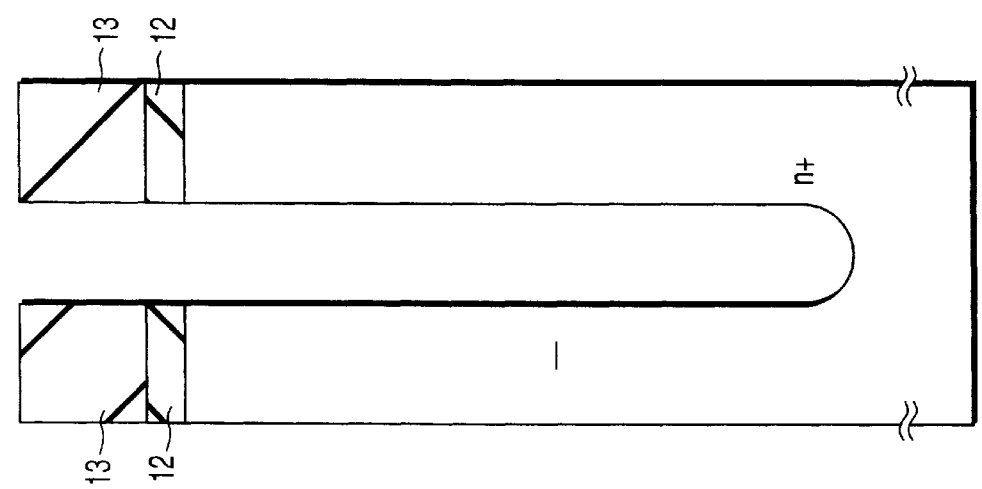
Figure 8A:
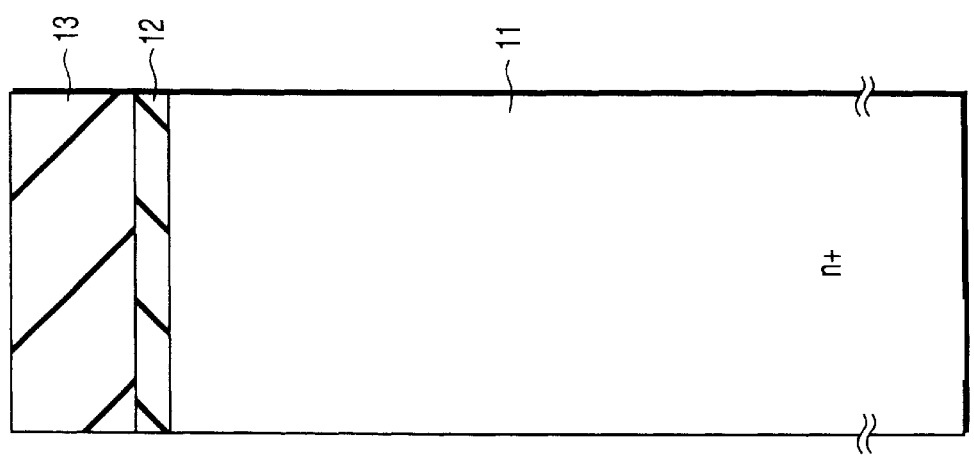

First, as shown in FIG. 8A, a 10-nm thick silicon oxide film 12 is formed on a single-crystal p-type silicon substrate 11 by thermal oxidation. A 500-nm thick silicon nitride film 13 is formed on this silicon oxide film 12 by CVD. The specific resistance of the p-type silicon substrate 11 is, e.g., 10 Ω cm, and its crystal face is, e.g., a (100) face.

As shown in FIG. 8B, the silicon nitride film 13, the silicon oxide film 12, and the p-type silicon substrate 11 are etched by using a resist (not shown) as a mask, thereby forming a trench 14. RIE (Reactive Ion Etching) is used as this etching.

As shown in FIG. 8C, a 5-nm thick thermal oxide film 15 is formed on the entire surface by thermal oxidation so as to cover the inner walls of the trench 14. A 10-nm thick silicon nitride film 16 is formed on the thermal oxide film 15 by CVD. A resist 17 is then formed on the entire surface so as to fill the trench 14.

Figure 8F:
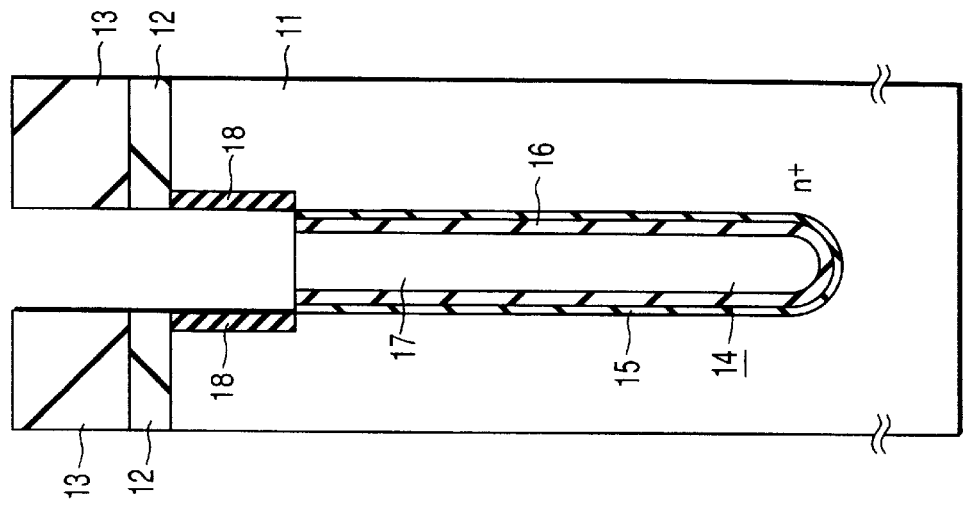
Figure 8E:
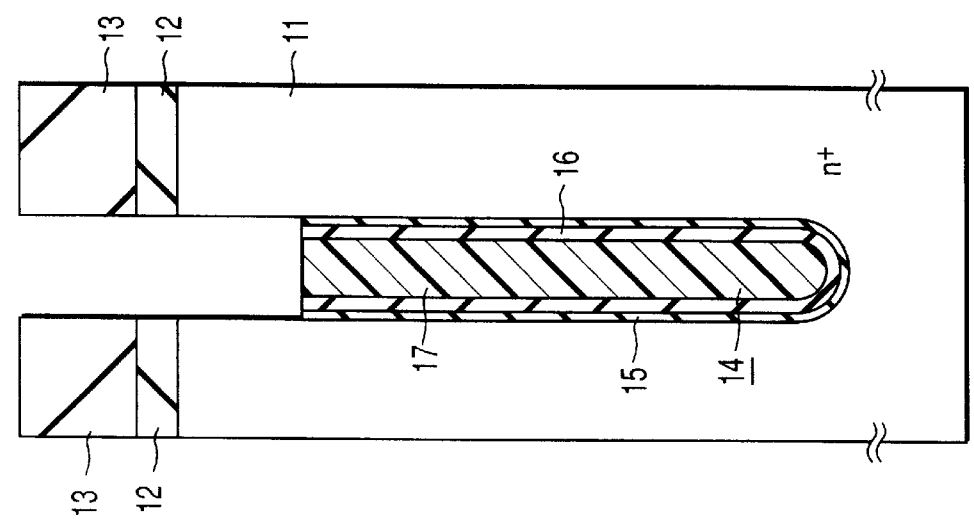
Figure 8D:
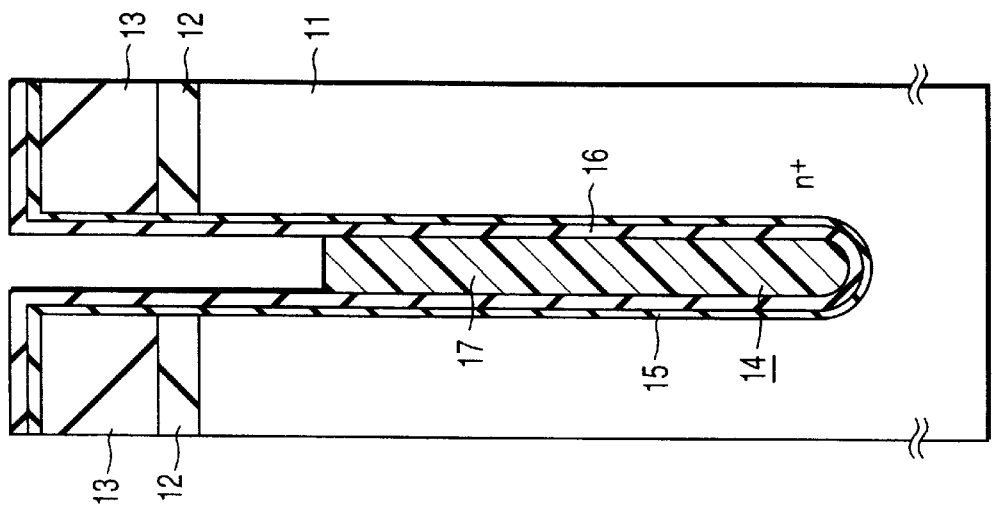

As shown in FIG. 8D, the resist 17 is irradiated with light and developed such that only the resist 17 buried in the trench 14 at a depth of 1.5 μm or less from the opening of the trench 14 selectively remains. The resist 17 remains in the trench 14 because light does not reach the bottom of the trench. Note that the resist 17 can also be partially removed by etching.

As shown in FIG. 8E, the resist 17 is used as a mask to sequentially etch the silicon nitride film 16 and the thermal oxide film 15, thereby exposing the side walls of the trench 14 in a portion not filled with the resist 17.

As shown in FIG. 8F, after residual 17 is also removed, a 30-nm thick thermal oxide film 18 is selectively formed on the side walls of the trench 14, which are exposed by removing the resist 17. After that, the silicon nitride film 16 and the thermal oxide film 15 are sequentially removed.

Next, in a batch type vertical CVD furnace, heat treatment is performed in a hydrogen ambient at 950° C. and 100 Torr for 1 hr to remove a native film (not shown) formed on the silicon substrate 11 below the trench 14.

As shown in FIG. 8G, heat treatment is successively performed in an $AsH_3$ ambient at 950° C. and 400 Torr for 1 hr in the same furnace with no exposure to the atmosphere, thereby diffusing arsenic in the silicon substrate 11 to form a heavily doped n-type impurity diffusion layer (plate electrode) 19.

As shown in FIG. 8H, heat treatment is successively performed in an $NH_3$ ambient at 950° C. and 10 Torr for 1 hr in the same furnace with no exposure to the atmosphere, thereby forming a 2-nm thick thermal nitride film (capacitor insulating film) 20. After that, another vertical batch type LPCVD apparatus is used to reexecute heat treatment in an $NH_3$ ambient at 950° C. and 10 Torr for 1 hr.

In this case, once the thermal oxide film is formed on the surface of the nitride film, the surface of the nitride film is protected from oxidation and rarely oxidized.

Next, as shown in FIG. 8H, a silicon nitride film (capacitor insulating film) 21 is successively formed on the thermal nitride film 20 in the same furnace with no exposure to the atmosphere by using CVD. $SiH_2Cl_2$ and $NH_3$ are used as materials.

Finally, as shown in FIG. 8I, the trench 14 is filled with an impurity amorphous silicon film (storage node electrode) 22 to complete the trench capacitor. After that, the DRAM cell is completed by forming element isolation trenches, MOS transistors, and the like in accordance with the well-know method.

In this embodiment, a native layer is removed by heat treatment in a hydrogen ambient before the formation of an n-type impurity diffusion layer. Additionally, a capacitor insulating film is successively formed without breaking vacuum after that. Since, therefore, the reformation of an oxide film (layer) such as a native film can be effectively prevented, the same effect as in the first embodiment can be obtained. Also, various modifications as described in the first embodiment can be made.

The present invention is not limited to the above embodiments. For example, in the above embodiments, an n-type impurity diffusion layer is formed by heat treatment (thermal diffusion) in an $AsH_3$ ambient. However, this n-type impurity diffusion layer can also be formed by another method. For example, the layer can be formed by heat treatment in a $PH_3$ ambient. Also, a p-type impurity diffusion layer can be formed by heating in, e.g., a $B_2H_6$ ambient.

Although a silicon nitride film (capacitor insulating film) is formed by CVD in the above embodiments, this silicon nitride film can also be formed by another method. For example, a silicon nitride film having a stacked structure can be formed by forming a silicon nitride film by thermal nitridation using $NH_3$ and depositing another silicon nitride film on it by CVD.

In the above embodiments, a silicon nitride film is used as a capacitor insulating film. However, another insulating film can also be used. For example, a high-permittivity film such as a tantalum pentoxide film can be used.

In the above embodiments, a state in which no oxide film grows is realized by successively forming an impurity diffusion layer and a capacitor insulating film in the same processing vessel. This state of allowing no oxide film growth can also be achieved by forming an impurity diffusion layer and a capacitor insulating film in different processing vessels.

One practical method is to set the temperature in a processing vessel to a temperature at which no oxide film forms when a silicon substrate is unloaded from and loaded into the processing vessel. Another practical method is to use an ambient, such as a nitrogen ambient, in which no oxide film forms as the ambient when a silicon substrate is unloaded from and loaded into a processing vessel.

In the above embodiments, a single-crystal silicon substrate is used. However, a polycrystalline silicon substrate or an SOI substrate can also be used.

Moreover, various modifications can be made without departing from the scope and spirit of the present invention.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A method of fabricating a semiconductor device, comprising the steps of:

removing an oxide film formed on a surface of a semiconductor substrate;

doping an impurity into the surface of said semiconductor substrate to form an impurity diffusion layer as a first capacitor electrode;

forming a capacitor insulating film on said impurity diffusion layer in a condition in which no oxide film grows; and forming a second capacitor electrode on said capacitor insulating film.

2. A method according to claim 1, wherein the step of forming said capacitor insulating film comprises the step of forming a silicon nitride film by chemical vapor deposition.

3. A method according to claim 1, wherein the step of forming said capacitor insulting film comprises the step of forming a first silicon nitride film by thermal nitridation.

4. A method according to claim 3, wherein the step of forming said capacitor insulating film comprises the step of forming a second silicon nitride film on said first silicon nitride film by chemical vapor deposition.

5. A method according to claim 1, wherein the step of forming said capacitor insulating film comprises the step of repeating a series of heat treatment steps a plurality of times, the series of heat treatment steps including a first heat treatment step performed in a first gas ambient containing silicon and not containing nitrogen and a second heat treatment step performed in a second gas ambient containing nitrogen and not containing silicon.

6. A method according to claim 5, wherein the first gas ambient contains a gas of at least one of silicon tetrachloride, silicon trichloride, and silicon dichloride.

7. A method according to claim 5, wherein the second gas ambient contains a gas of at least one of ammonia, ammonia trifluoride, hydrazine, dimethylhydrazine, and monomethylhydrazine.

8. A method according to claim 5, wherein the surface of said impurity diffusion layer is nitrided before the first heat treatment step.

9. A method according to claim 1, wherein said first and second capacitor electrodes are a plate electrode and a storage node electrode, respectively, of a trench capacitor.

10. A method according to claim 1, wherein the condition in which no oxide film grows is realized by forming said impurity diffusion layer in a vessel and successively forming said capacitor insulating film in said vessel without unloading said semiconductor substrate from said vessel.

11. A method according to claim 1, wherein said oxide film is a native film.

12. A method according to claim 1, wherein said semiconductor substrate is a silicon substrate.

* * * * *

UNITED STATES PATENT AND TRADEMARK OFFICE
CERTIFICATE OF CORRECTION

PATENT NO. : 6,146,938
DATED : November 14, 2000
INVENTOR(S) : Shigehiko Saida et al.

It is certified that error appears in the above-identified patent and that said Letters Patent is hereby corrected as shown below:

Column 10,
Line 54, "insulting" should read -- insulating --.

Signed and Sealed this

Thirtieth Day of April, 2002

Attest:

Attesting Officer

JAMES E. ROGAN
Director of the United States Patent and Trademark Office